(12) United States Patent
Manoo

(10) Patent No.: US 6,738,958 B2
(45) Date of Patent: May 18, 2004

(54) MODIFYING A HIERARCHICAL REPRESENTATION OF A CIRCUIT TO PROCESS COMPOSITE GATES

(75) Inventor: Masoud Manoo, Zebulon, NC (US)

(73) Assignee: Numerical Technologies, Inc., Mountain View, CA (US)

(*) Notice: Subject to any disclaimer, the term of this patent is extended or adjusted under 35 U.S.C. 154(b) by 103 days.

(21) Appl. No.: 09/953,119

(22) Filed: Sep. 10, 2001

(65) Prior Publication Data

US 2003/0051219 A1 Mar. 13, 2003

(51) Int. Cl.$^7$ ............................................. G06F 17/50
(52) U.S. Cl. ........................ 716/11; 716/19; 716/21; 430/5
(58) Field of Search ......................... 716/1–21; 430/5

(56) References Cited

U.S. PATENT DOCUMENTS

| | | | |
|---|---|---|---|
| 4,037,918 A | 7/1977 | Kato | 350/3.5 |
| 4,456,371 A | 6/1984 | Lin | 355/71 |
| 5,182,718 A | 1/1993 | Harafuji et al. | 364/490 |
| 5,302,477 A | 4/1994 | Dao et al. | 430/5 |
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,432,714 A | 7/1995 | Chung et al. | 364/525 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |

(List continued on next page.)

OTHER PUBLICATIONS

Cooke, M., "OPC/PSM Designs For Poly Gate Layers", European Semiconductor, vol. 22, No. 7, pp. 57–59, Jul. 2000.

(List continued on next page.)

Primary Examiner—Vuthe Siek
(74) Attorney, Agent, or Firm—Park, Vaughan & Fleming LLP

(57) ABSTRACT

One embodiment of the invention provides a system for analyzing a layout related to a circuit on a semiconductor chip. The system operates by receiving a design hierarchy specifying the layout of the circuit. This design hierarchy includes a set of hierarchically organized nodes, wherein a given node in the design hierarchy specifies a geometrical feature that is comprised of lower-level geometrical features that are represented by lower-level nodes located under the given node in the design hierarchy. The system modifies the design hierarchy by, examining a set of sibling nodes that are located under a parent node in the design hierarchy in order to identify a set of interacting geometrical features between the set of sibling nodes. The system then moves the set of interacting geometrical features from the sibling nodes to the parent node, so that the interaction is visible at the parent node. Note that other geometrical features that do not interact remain at the sibling nodes and are not moved to the parent node. The system then performs an analysis on the modified design hierarchy. This involves analyzing the set of interacting geometrical features at the parent node.

22 Claims, 7 Drawing Sheets

U.S. PATENT DOCUMENTS

| | | | |
|---|---|---|---|
| 5,472,814 A | 12/1995 | Lin | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,533,148 A | 7/1996 | Sayah et al. | 382/240 |
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,631,110 A | 5/1997 | Shioiri et al. | 430/5 |
| 5,635,316 A | 6/1997 | Dao | 430/5 |
| 5,636,131 A | 6/1997 | Liebmann et al. | 364/490 |
| 5,657,235 A | 8/1997 | Liebmann et al. | 364/474.24 |
| 5,682,323 A | 10/1997 | Pasch et al. | 364/491 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,815,685 A | 9/1998 | Kamon | 395/500 |
| 5,827,623 A | 10/1998 | Ishida et al. | 430/5 |
| 5,847,959 A | 12/1998 | Veneklasen et al. | 364/468.28 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,009,250 A | 12/1999 | Ho et al. | 395/500.06 |
| 6,009,251 A | 12/1999 | Ho et al. | 395/500.06 |
| 6,010,807 A | 1/2000 | Lin | 430/5 |
| 6,011,911 A | 1/2000 | Ho et al. | 395/500.06 |
| 6,057,063 A | 5/2000 | Liebmann et al. | 430/5 |
| 6,064,806 A | 5/2000 | Lakos et al. | 395/500.04 |
| 6,066,180 A | 5/2000 | Kim et al. | 716/19 |
| 6,077,310 A | 6/2000 | Yamamoto et al. | 716/19 |
| 6,077,630 A | 6/2000 | Pierrat | 430/5 |
| 6,081,658 A | 6/2000 | Rieger et al. | 395/500.22 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,339,836 B1 | 1/2002 | Eisenhofer et al. | 716/5 |
| 6,370,679 B1 | 4/2002 | Chang et al. | 716/19 |
| 6,420,074 B2 | 7/2002 | Wang et al. | 430/5 |
| 6,436,590 B2 | 8/2002 | Wang et al. | 430/5 |
| 6,453,452 B1 | 9/2002 | Chang et al. | 716/8 |
| 6,505,327 B2 * | 1/2003 | Lin | 716/5 |
| 6,560,766 B2 * | 5/2003 | Pierrat et al. | 716/19 |
| 2001/0000240 A1 | 4/2001 | Wang et al. | 430/5 |
| 2001/0028985 A1 | 10/2001 | Wang et al. | 430/5 |
| 2002/0010904 A1 | 1/2002 | Ayres | 716/19 |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152449 A1 | 10/2002 | Lin | 716/17 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 698 821 | 2/1996 |
| GB | 2333613 A | 7/1999 |
| JP | 62067547 | 3/1987 |
| JP | 2-140743 | 5/1990 |
| JP | 7-111528 | 2/1991 |
| JP | 3-80525 | 4/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 97/38381 | 10/1997 |
| WO | WO 98/12605 A1 | 3/1998 |
| WO | WO 99/14636 A1 | 3/1999 |
| WO | WO 99/14637 A1 | 3/1999 |
| WO | WO 99/14638 A1 | 3/1999 |
| WO | WO 01/23961 A1 | 4/2001 |
| WO | WO 02/03140 A1 | 1/2002 |
| WO | WO 02/29491 A1 | 4/2002 |
| WO | WO 02/073312 A1 | 9/2002 |

OTHER PUBLICATIONS

Granik, Y., et al., "Sub–Resolution Process Windows And Yield Estimation Technique Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Lithas, "Lithas: Optical Proximity Correction Software" (2 pages), No date.

Wang, R., et al., "Plarized Phase Shift Mask: Concept, Design, and Potential Advantages to Photolithography Process and Physical Design", Motorola Semiconductor Product Sector (12 pages), No date.

Ogawa, K., et al., "Phase Defect Inspection by Differential Interference", Lasertec Corporation (12 pages), No date.

Pistor, T., "Rigorous 3D Simulation of Phase Defects in Alternating Phase–Shifting Masks", Panoramic Technology Inc. (13 pages), No date.

Semmier, A., et al., "Application of 3D EMF Simulation for Development and Optimization of Alternating Phase Shifting Masks", Infineon Technologies AG (12 pages), No date.

Wong, et al., "Polarization Effects in Mask Transmission", University of California Berkeley (8 pages), No date.

Terasawa, T., et al., "Imaging Characteristics of Multi–Phase–Shifting and Halftone Phase–Shifting Masks", Japanese Journal of Applied Physics, vol. 30, No. 11B, pp. 2991–2997, Nov. 1991.

Inoue, S., et al., "Stimulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Ohtsuka, H., et al., "Evaluation of Repair Phase and Site Tolerance for a Phase–Shift Mask", J. Vac. Sci. Technol. B, vol. 11, No. 6, pp. 2665–2668, Nov./Dec. 1993.

Ohnuma, II., et al., "Lithography Computer Aided Design Technology for Embedded Memory in Logic", Jpn. J. Appl. Phys., vol. 37, Part I, No. 12B, pp. 6686–6688, Dec. 1998.

Kikuchi, K., et al., "Method of Expanding Process Window for the Double Exposure Technique with alt–PSMs", Optical Microlithography XIII, Proceeding of SPIE, vol. 4000, pp. 121–131 (2000).

Liebmann, L.W., et al., "TCAD Development For Lithography Resolution Enhancement", IBM J. Res. & Dev., vol. 45, No. 5, pp. 651–665, Sep. 5, 2001.

Ackmann, P., et al., "Phase Shifting and Optical Proximity Corrections to Improve CD Control on Logic Devices in Manufacturing for Sub 0.35 um I–Line", Advance Micro Devices (8 pages), No date.

Matsuoka, K., et al., "Application of Alternating Phase–Shifting Mask to 0.16um CMOS Logic Gate Patterns", Matsushita Electric Ind. Co., Ltd. (9 pages), No date.

Rieger, M., et al., "Using Behavior Modeling for Proximity Correction", Precim Company, Portland, Oregon (6 pages), No date.

Spence, C., et al., "Detection of 60(degree) Phase Defects on Alternating PSMs", Advanced Micro Devices, KLA–Tencor, DuPont RTC (2 pages), No date.

Sugawara, M., et al., "Defect Printability Study of Attenuated Phase–Shifting Masks for Specifying Inspection Sensitivity", Sony Corporation, Kanagawa, Japan (16 pages), No date.

Schmidt, R., et al., "Impact of Coma on CD Control for Multiphase PSM Designs", AMD, ASML (11 pages), No date.

Erdmann, A., "Topography Effects and Wave Aberrations in Advanced PSM–Technology", Fraunhofer Institute of Integrated Circuits (11 pages), No date.

Granik, Y., et al., "CD Variation Analysis Technique and its Applications to the Study of PSM Mask Misalignment", Mentor Graphics (9 pages), No date.

Hanyu, et al., "New Phase–Shifting Mask with Highly Transparent SiO2 Phase Shifters", Fijitsu Laboratories Ltd. (11 pages), No date.

Ishiwata, N., et al., "Fabrication of Phase–Shifting Mask", Fijitsu Limited (11 pages), No date.

Levenson, M., et al., "Phase Phirst! An Improved Strong–PSM Paradigm", M.D. Levenson Consulting, Petersen Advanced Lithography, KLA–Tencor (10 pages), No date.

Levenson, M., et al., "SCAA Mask Exposures and Phase Phirst Design for 110nm and Below", M.D. Levenson Consulting, Canon USA, Inc., JSR Microelectronics, Inc. (10 pages), No date.

Lin, B.J., "The Relative Importance of the Building Blocks for 193nm Optical Lithography", Linnovation, Inc. (12 pages), No date.

McCallum, M., et al., "Alternating PSM Mask Performance—a Study of Multiple Fabrication Technique Results", International SEMATECH (6 pages), No date.

Morikawa, Y., et al., "100nm–alt.PSM Structure Discussion for ArF Lithography", Dai–Nippon Printing Co., Ltd. (15 pages), No date.

Ozaki, T., et al., "A 0.15um KrF Lithography for 1Gb DRAM Product Using Highly Printable Patterns and Thin Resist Process", Toshiba Corporation (2 pages), No date.

Rhyins, P., et al., "Characterization of Quartz Etched PSM Masks for KrF Lithography at 100nm Node", Photonics, Inc., MIT Lincoln Lab, ARCH Chemicals, Finle Technologies, KLA Tencor Corp. (10 pages), No date.

Ronse, K., et al., "Thin Film Interference Effects in Phase Shifting Masks Causing Phase and Transmittance Errors", IMEC (15 pages), No date.

Rosenbluth, A., et al., "Optimum Mask and Source Patterns to Print a Given Shape", IBM (17 pages), No date.

Sakata, M., et al., "A Novel Radiation Sensitive Spin–on–Glass Convertible into SiO2 and the Simple Fabrication Process Using It", Oki Electric Industry Co. Ltd. (3 pages), No date.

Schmidt, R., et al., "Impact of Coma on CD Control for Multiphase PSM Designs", AMD, ASML (10 pages), No date.

Sewell, H., et al., "An Evaluation of the Dual Exposure Technique", SVG Lithography Systems Inc. (11 pages), No date.

Spence, C., et al., "Optimization of Phase–Shift Mask Designs Including Defocus Effects", AMD, Princeton University, Vecor Technologies Inc. (8 pages), No date.

Suzuki, A., et al., "Multilevel Imaging System Realizing k1=–.3 Lithography", Canon Inc. (13 pages), No date.

Vandenberghe, G., et al., "(Sub–)100 nm Gate Patterning Using 248nm Alternating PSM", IMEC, Mentor Graphics (9 pages), No date.

Fritze, M., et al., "100–nm Node Lithography with KrF?", MIT Lincoln Lab, Numberical Technologies, Photronics, Arch Chemicals (14 pages), No date.

Fukuda, H., et al., "Patterning of Random Interconnect Using Double Exposure of Strong–Type PSMs", Hitachi Central Research Lab (8 pages), No date.

Ferguson, R., et al., "Pattern–Dependent Correction of Mask Topography Effects for Alternating Phase–Shifting Masks", IBM Microelectronics, University of California Berkeley (12 pages), No date.

Toublan, O., et al., "Phase and Transmission Errors Aware OPC Solution for PSM: Feasibility Demonstration", Mentor Graphics Corp. (7 pages), No date.

Yanagishita, Y., et al., "Phase–Shifting Photolithography Applicable to Real IC Patterns", Fujitsu Limited (11 pages), No date.

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Product Sizes in Openings in Photo Images Smaller Than Lithographic Minimum Size", IBM Technical Disclosure Bulletin, vol. 29, No. 3, p. 1328, Aug. 1986.

Terasawa, T., et al., "0.3–Micron Optical Lithography Using a Phase–Shifting Mask", SPIE, Optical/Laser Microlithography II, vol. 1088, pp. 25–33, Mar. 1989.

Buraschi, M., et al., "Optical–Diffraction–Based Modulation of Photoresist Profile on Microlithography Applications", Optical Engineering, vol. 28, No. 6, pp. 654–658, Jun. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Masks", IEDM, pp. 33.2.1–33.32.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shifting Mask", 1991 Symposium on VLSI Technology, Digest of Technical Papers, pp. 95–96, May 28–30, 1991.

Wong, et al., "Investigating Phase–Shifting Mask Layout Issues Using a Cad Toolkit", IEEE, pp. 27.4.1–27.4.4 (1991).

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Asai, S., et al., "High Performance Optical Lithography Using a Separated Light Source", J. Vac. Sci. Technol. B, vol. 10, No. 6, pp. 3023–3026, Nov./Dec. 1992.

Jinbo, H., et al., "Application of Blind Method to Phase–Shifting Lithography", IEEE, 1992 Symposium On VLSI Technology Digest Of Technical Papers, pp. 112–113 (1992).

Ohtsuka, H., et al.,. "Phase Defect Repair Method for Alternating Phase Shift Masks Conjugate Twin–Shifter Method", Jpn. J. Appl. Phys., vol. 31, pp. 4143–4149 (1992).

Pierrat, C., et al., "Phase–Shifting Mask Topography Effects on Lithographic Image Quality", IEEE, pp. 3.3.1–3.3.4 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Burggraaf, P., "Lithography's Leading Edge, Part 1: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Brunner, T., "Rim Phase–Shift Mask Combined with Off–Axis Illumination: A Path to 0.5(lampda) / Numerical Aperture Geometries", Optical Engineering, vol. 32, No. 10, pp. 2337–2343, Oct. 1993.

Harafuji, K., et al., "A Novel Hierarchical Approach for Proximity Effect Correction in Electron Beam Lithography", IEEE, vol. 12, No. 10, pp. 1508–1514, Oct. 1993.

Lin, B.J., "Phase–Shifting Masks Gain an Edge", IEEE Circuits & Devices, pp. 28–35, Mar. 1993.

Liu, H.Y., et al., "Fabrication of 0.1um T–Shaped Gates by Phase–Shifting Optical Lithography", SPIE, Optical/Laser Microlithography VI, vol. 1927, pp. 42–52 (1993).

Nistler, J., et al., "Phase Shift Mask Defect Printability Analysis", Proceedings Of The Microlithography Seminar INTERFACE '93, OCG Microelectronic Materials, Inc., pp. 11–28 (1993).

Rieger, M., et al., "System for Lithography Proximity Compensation", Precim Company, Portland, Oregon, Sep. 1993 (28 pages).

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1993.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Ronse, K., et al., "Comparison of Various Phase Shift Strategies and Application to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Mask-making and its Application", J. Vac. Sci. Technol. B, vol. 11, No. 6, pp. 2669–2674, Nov./Dec. 1993.

Galan, G., et al., "Application of Alternating–Type Phase Shift Mask to Polysilicon Level for Random Circuits", Jpn. J. Appl. Phys., vol. 33, pp. 6779–6784 (1994).

Mizuno, F., et al., "Practical Phase–Shifting Mask Technology for 0.3um Large Scale Integration", J. Vac. Sci. Techol. B, vol. 12, No. 6, pp. 3799–3803, Nov./Dec. 1994.

Nistler, J., et al., "Large Area Optical Design Rule Checker for Logic PSM Application", SPIE, Photomask And X–Ray Mask Technology, vol. 2254, pp. 78–92 (1994).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Pierrat, C., et al., "A Rule–Based Approach to E–Beam and Process–Induced Effect Correction for Phase–Shifting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Wafer Proximity Correction with Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Karklin, L., "A Comprehensive Simulation Study of the Photomask Defects Printability", SPIE, vol. 2621, pp. 490–504 (1995).

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Nagahiro, Y., "Improved Mask Techniques for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Accuracy", SPIE, Proceedings Of The 17th Annual Symposium On Photomask Technology And Management, vol. 3236, pp. 243–249 (1997).

Morimoto, H., et al., "Next Generation Mask Strategy—Technologies are Ready for Mass Production of 256MDRAM?", SPIE, vol. 3236, pp. 188–189 (1997).

Roman, B., et al., "Implications of Device Processing on Photomask CD Requirements", SPIE, vol. 3236 (1997) (Abstract Only).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages), No date.

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Fukuda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Kuo, C., et al.,"Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages), No date.

Cote, M., et al., "A Practical Application of Full–Feature Alternating Phase–Shifting Technology for a Phase–Aware Standard–Cell Design Flow", Numerical Technologies Inc. (6 pages), No date.

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

* cited by examiner

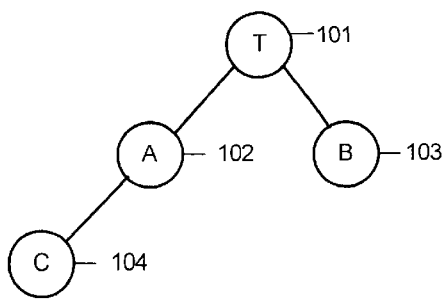
FIG. 1A
(PRIOR ART)
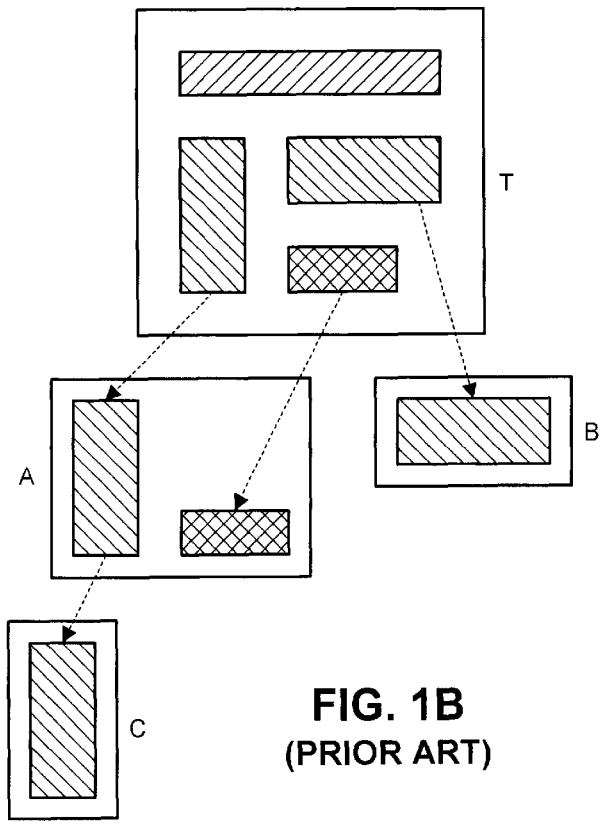
FIG. 1B
(PRIOR ART)
```
T
{
    REF LIST AT_A, BT_B
}
A
{
    ▨▨▨▨▨▨▨
    REF LIST CT_CA
}
B
{
    ▨▨▨
}
C
{
    ▨
}
```
FIG. 1C
(PRIOR ART)

MODIFYING A HIERARCHICAL REPRESENTATION OF A CIRCUIT TO PROCESS COMPOSITE GATES

RELATED APPLICATION

The subject matter of this application is related to the subject matter in a co-pending non-provisional application by the same inventor as the instant application and filed on the same day as the instant application entitled, "Modifying a Hierarchical Representation of a Circuit to Process Features Created by Interactions Between Cells," having Ser. No. 09/952,896, and filing date Sep. 10, 2001.

BACKGROUND

1. Field of the Invention

The invention relates to the process of designing an integrated circuit. More specifically, the invention relates to a method and an apparatus for modifying a hierarchical representation of a circuit in order to efficiently analyze features created by interactions between cells in the hierarchical representation.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions, which are generally formed of quartz, is then positioned over this photo resist layer coated wafer. (Note that the term "mask" as used in this specification is meant to include the term "reticle.") Exposure energy is then shone on the mask from an exposure energy source, such as a visible light source or an ultraviolet light source.

This exposure energy is generally reduced and focused through an optical system that contains a number of lenses, filters and mirrors. The exposure energy passes through the clear regions of the mask and exposes the underlying photoresist layer. At the same time, the exposure energy is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

A layout for a semiconductor chip is often stored in a standard hierarchical format, such as GDSII stream format. For example, FIGS. 1A, 1B and 1C illustrate how a layout, T, can be composed of a sub-cell A and a sub-cell B, wherein the sub-cell A further includes a sub-cell C. FIG. 1A illustrates a nodal representation of this hierarchy, while FIG. 1B illustrates a corresponding graphical representation.

FIG. 1C presents a specification of the layout in code form. In this form, the layout, T, includes a reference list. This reference list includes a reference to cell A along with an associated transformation, $T_A$, and a reference to cell B along with an associated transformation, $T_B$. Similarly, the layout for cell A includes geometrical features associated with cell A along with a reference cell C. This reference to cell C is accompanied by a transformation of cell C with respect to A, $T_{CA}$. The layouts for cell B and cell C include geometrical features associated with cell B and cell C, respectively.

Representing a layout in a hierarchical form can cause problems for various operations related to fabrication of a semiconductor chip, because interactions between nodes within the hierarchical representation can cause unintended results. These problems can be remedied by collapsing the hierarchy down into a single monolithic layout before performing the operations. Unfortunately, this can be prohibitively slow because the operations must be applied to the entire monolithic layout, even though many of the cells in the layout may be repeated.

What is needed is a method and an apparatus for performing a computational operation on a hierarchical representation of a layout without performing the computational operation over the entire layout, and without the above-described problems associated with using a hierarchical representation.

In particular, one problem arises during the generation of phase shifters. Phase shifters are often incorporated into a mask in order to achieve line widths that are smaller than the wavelength of the exposure energy that is used to expose the photoresist layer through the mask. During phase shifting, the destructive interference caused by two adjacent clear areas on a mask is used to create an unexposed area on the photoresist layer. This is accomplished by exploiting the fact that exposure energy passing through a mask's clear regions exhibits a wave characteristic having a phase that is a function of the distance the exposure energy travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the exposure energy exiting the material of thickness $t_2$ is 180 degrees out of phase with the exposure energy exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999, which is hereby incorporated by reference.

For example, referring to FIG. 2A, a phase shifter is composed of a zero degree phase clear area 254 that works in concert with a 180-degree phase clear area 258 to reduce the width of polysilicon line 256 in the gate region of a transistor 250. This first transistor selectively creates a conducting path between diffusion region 252 and diffusion region 260.

Note that a thin chromium regulator 255 can be added to the mask between zero-degree phase clear area 254 and 180-degree phase clear area 258 in order to better control gate width.

The phase shifter is typically incorporated into a separate phase shifting mask, which is used to reduce the width of polysilicon line 256 in the gate region of transistor 250.

Phase shifters are typically extended past the active diffusion region of a transistor by a certain margin. For example, in FIG. 2B, the phase shifter comprised of the zero-degree phase region 204 and 180-degree phase region 206 is extended past the endcap of the transistor by an endcap margin 212 (for example, 200 nm). On the other side of the transistor, the phase shifter is extended past the active diffusion region by a fieldcap margin 214 (for example, 80 nm). Note that the endcap margin 212 is larger than the fieldcap margin 214 because the transistor endcap may be susceptible to line end shortening, which can be somewhat mitigated by extending the phase shifter by an additional margin.

Sizing phase shifters can be a problem in a hierarchical layout because interactions between cells may case endcaps to become fieldcaps. For example in FIG. 3A, endcap 306 in cell 302 joins with endcap 316 in cell 304 so that they are no longer endcaps. Similarly, in FIG. 3B, endcap 306 in cell 302 interacts with polysilicon region 322 in cell 320 to form a fieldcap. In both of these examples, it is desirable to know that the inter-cell interactions cause endcaps 306 and 316 to become fieldcaps in order to appropriately size the phase shifters. However, using existing techniques, this can only be accomplished by collapsing the design hierarchy so that the interactions become visible. As mentioned above, collapsing the design hierarchy can greatly increase the time required to process the layout.

Hence, what is needed is a method and an apparatus for forming phase shifters using a hierarchical representation of a layout without unnecessarily collapsing the layout.

SUMMARY

One embodiment of the invention provides a system for analyzing a layout related to a circuit on a semiconductor chip. The system operates by receiving a design hierarchy specifying the layout of the circuit. This layout includes a set of hierarchically organized nodes, wherein a given node specifies a geometrical feature that is comprised of lower-level geometrical features that are represented by lower-level nodes located under the given node in the design hierarchy. The system operates by modifying the design hierarchy by examining a set of sibling nodes that are located under a parent node in the design hierarchy in order to identify a set of interacting geometrical features between the set of sibling nodes. Next, the system then moves the set of interacting geometrical features to a new child node under the parent node, and then performs an analysis on the modified design hierarchy.

In one embodiment of the invention, the system identifies other sets of sibling nodes with equivalent sets of interacting geometrical features. This allows the system to use the new child node in analyzing the other sets of sibling nodes, so that additional child nodes do not have to be recreated for the other sets of sibling nodes.

In one embodiment of the invention, while moving the set of interacting geometrical features to the new child node, the system first moves the set of interacting geometrical features from the set of sibling nodes to the parent node. Next, the system creates the new child node under the parent node, and then moves the set of interacting geometrical features from the parent node to the new child node.

In one embodiment of the invention, the system also identifies a second set of interacting geometrical features between the parent node and the set of sibling nodes. The system then moves this second set of interacting geometrical features from the parent node to the set of sibling nodes.

In one embodiment of the invention, performing the analysis involves identifying transistors and associated transistor endcaps within the circuit, wherein the set of interacting geometrical features defines at least some of the transistors and associated transistor endcaps. Next, the system generates phase shifters to be used in fabricating some of the identified transistors, wherein the layout of a given phase shifter is affected by a location of an associated endcap for the given phase shifter.

In one embodiment of the invention, the set of interacting geometrical features define diffusion regions on the semiconductor chip.

In one embodiment of the invention, the layout can define either features on the semiconductor chip, or a mask that is used to create features on the semiconductor chip.

In one embodiment of the invention, the design hierarchy is specified in GDSII format.

One embodiment of the invention provides a system for analyzing a layout related to a circuit on a semiconductor chip. The system operates by receiving a design hierarchy specifying the layout of the circuit. This design hierarchy includes a set of hierarchically organized nodes, wherein a given node in the design hierarchy specifies a geometrical feature that is comprised of lower-level geometrical features that are represented by lower-level nodes located under the given node in the design hierarchy. The system modifies the design hierarchy by, examining a set of sibling nodes that are located under a parent node in the design hierarchy in order to identify a set of interacting geometrical features between the set of sibling nodes. The system then moves the set of interacting geometrical features from the sibling nodes to the parent node, so that the interaction is visible at the parent node. Note that other geometrical features that do not interact remain at the sibling nodes and are not moved to the parent node. The system then performs an analysis on the modified design hierarchy. This involves analyzing the set of interacting geometrical features at the parent node.

In one embodiment of the invention, the system determines at a parent node whether interactions between related sibling nodes cause transistor endcaps to become fieldcaps, and if so, moves geometrical features that caused the interactions to the parent node.

In one embodiment of the invention, the set of interacting geometrical features define polysilicon regions and diffusion regions on the semiconductor chip.

BRIEF DESCRIPTION OF THE FIGURES

FIG. 1A illustrates a hierarchical representation of a layout in nodal form.

FIG. 1B illustrates a hierarchical representation of the layout in graphical form.

FIG. 1C illustrates a hierarchical representation of the layout in code form.

DETAILED DESCRIPTION

Layout Processing

Figure 2A:
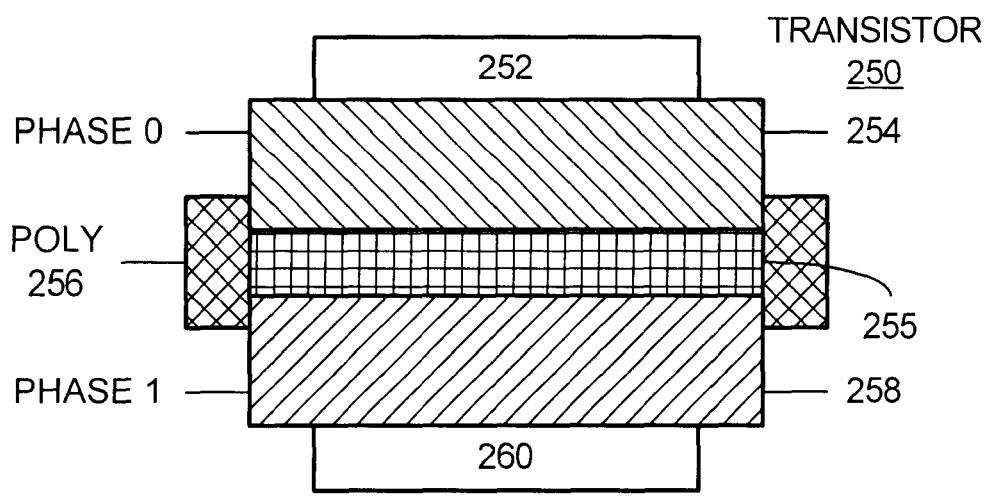
FIG. 2A illustrates a phase shifter used to form a transistor.
Figure 2B:
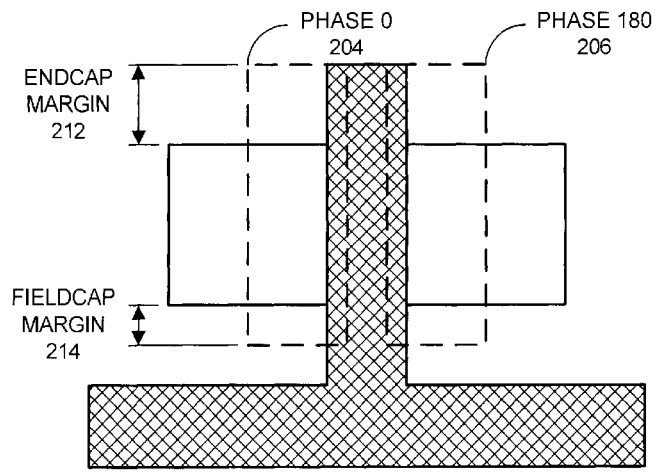
FIG. 2B illustrates endcap and fieldcap margins for a phase shifter.
Figures 3A, 3B:
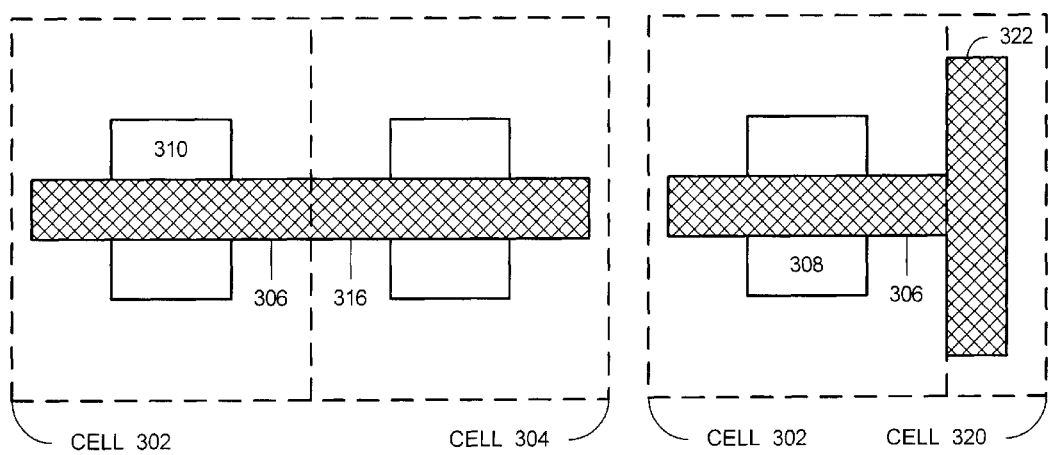
FIG. 3A illustrates an interaction between transistor endcaps in different cells.
FIG. 3B illustrates an interaction between a transistor endcap and a polysilicon line from different cells.
Figure 4:
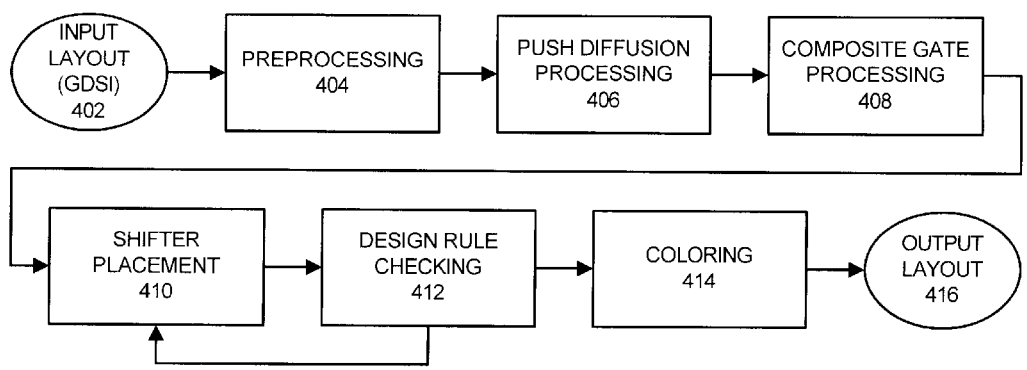
FIG. 4 illustrates the processing of a hierarchical layout in accordance with an embodiment of the invention.

FIG. 4 illustrates the processing of a hierarchical layout in accordance with an embodiment of the invention. The system starts with an input layout 402 in a hierarchical format, such as GDSII stream format. Next, the system performs a preprocessing operation 404, which modifies cells in input layout 402 in order to improve the efficiency of subsequent processing operations. For example, the system may collapse small cells that contain too few geometrical features (shapes) into other cells. This reduces the inefficiency of having to process too many small cells. The system may also merge cells that have too many overlapping geometrical features.

Next, the system performs "push diffusion" processing 406. This operation can move features that specify diffusion regions down to child nodes that have interacting polys with diffusion regions from parent or other sibling nodes, and can thereby create new gates at the child nodes. This process is described in more detail below with reference to FIG. 5.

The next process involves performing "composite gate" processing 408 to move to the common parent the interacting gates from child nodes. This composite gate processing is described in more detail below with reference to FIG. 6.

Note that some embodiments of the present invention perform only push diffusion processing 406 and not composite gate processing 408, while other embodiments perform only composite gate processing 408 and not push diffusion processing 406. Yet other embodiments perform both push diffusion processing 406 and composite gate processing 408.

Next, the system performs a shifter placement operation 410 to place phase shifters over identified transistors. Note that these phase shifters are sized based upon the existence of endcaps and fieldcaps on the transistors. The system also performs a design rule checking operation 412 to ensure that the shifter placement does not violate design rules. Note that the system may additionally iterate the shifter placement operation 410 and the design rule checking operation 412 in order to satisfy the design rules.

The system also performs a coloring operation 414 on the phase shifters to ensure that the phase shifters do not violate coloring constraints. During the coloring operation 414, the zero-degree phase regions and the 180-degree phase regions of the shifters are colored with different colors. The system then checks for unintended interactions between differently colored regions in order to prevent unintended side effects during the phase shifting process.

After the coloring operation 414, the system produces output layout 416, which includes phase shifters used to produce the circuit.

Push Diffusion Process

Figure 5A:
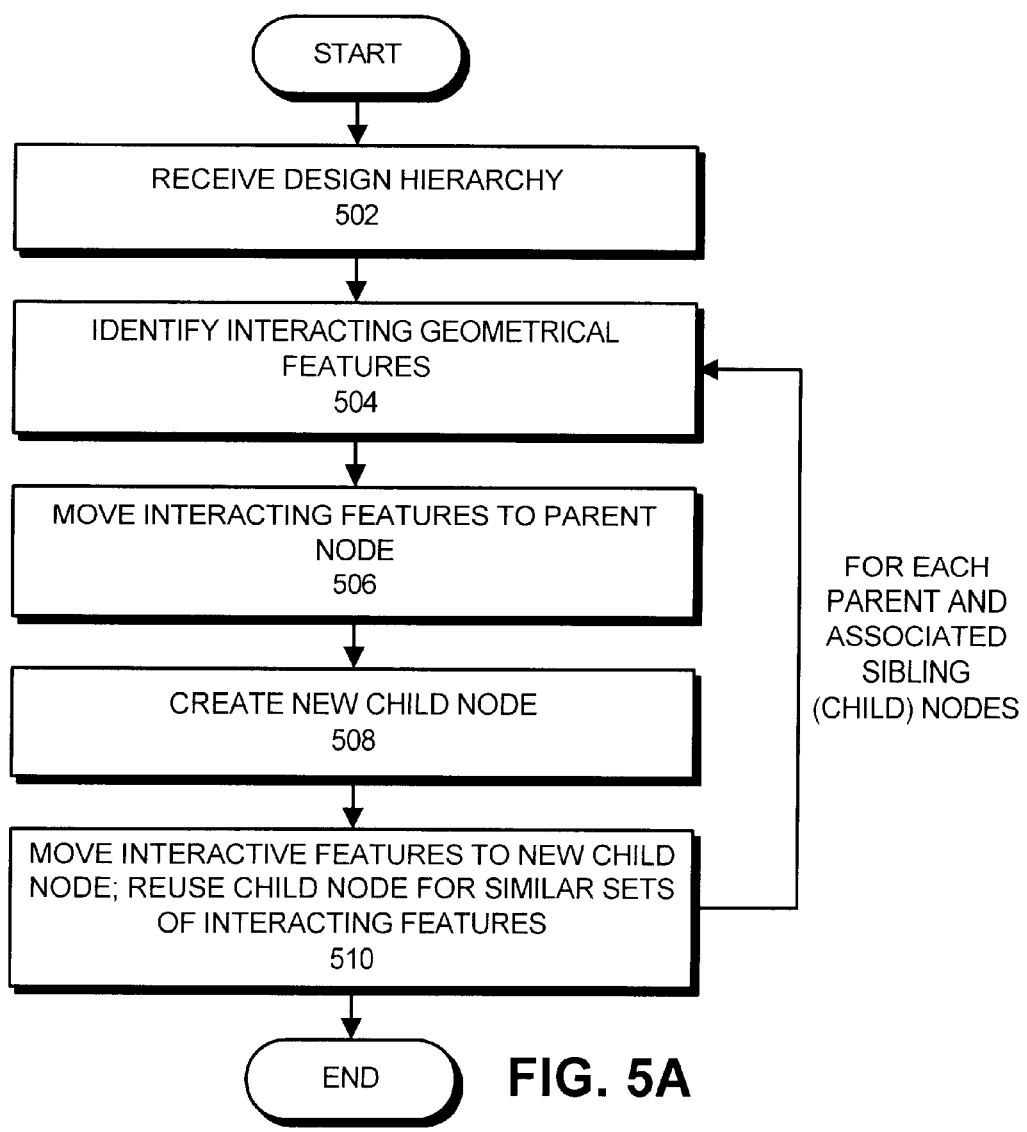
FIG. 5A presents a flow chart illustrating the "push diffusion" process in accordance with an embodiment of the invention.
Figure 5B:
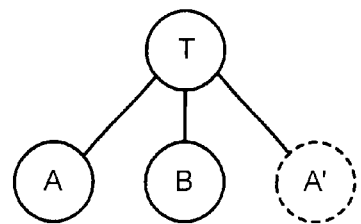
FIG. 5B illustrates and exemplary hierarchical layout in accordance with an embodiment of the invention.

FIG. 5A presents a flow chart illustrating the push diffusion process in accordance with an embodiment of the invention. The system starts by receiving a design hierarchy that specifies the circuit layout (step 502).

Next, the system performs the following operations for each parent node and associated child node in the design hierarchy. The system first identifies interacting diffusion and poly geometries (step 504). These interactions can take place between child (sibling) nodes or between the parent node and the child nodes. For example, in FIG. 5B, the system finds interaction regions between child nodes A and B, as well as interactions between parent node T and child nodes A and B. Next, the system moves the diffusion geometries within these interacting regions to the parent node T (step 506). In one embodiment of the present invention, these interacting features define diffusion regions in the circuit.

Next, the system identifies the child cells that have poly geometries that interact with these diffusion geometries, and creates a new clone copy of child node, A', (step 508) and then moves the interacting geometrical features to the new child node, A' (step 510).

Note that during the above-described process features that do not interact remain at child nodes, A and B, and parent node, T. Also note that diffusion geometries within child nodes that interact with poly geometries within parent nodes are moved to the parent nodes.

The process also identifies identical geometries that are being moved to different instances of the same cell in order to minimize numbers of the clones created for the cell.

Composite Gate Processing

Figure 6:
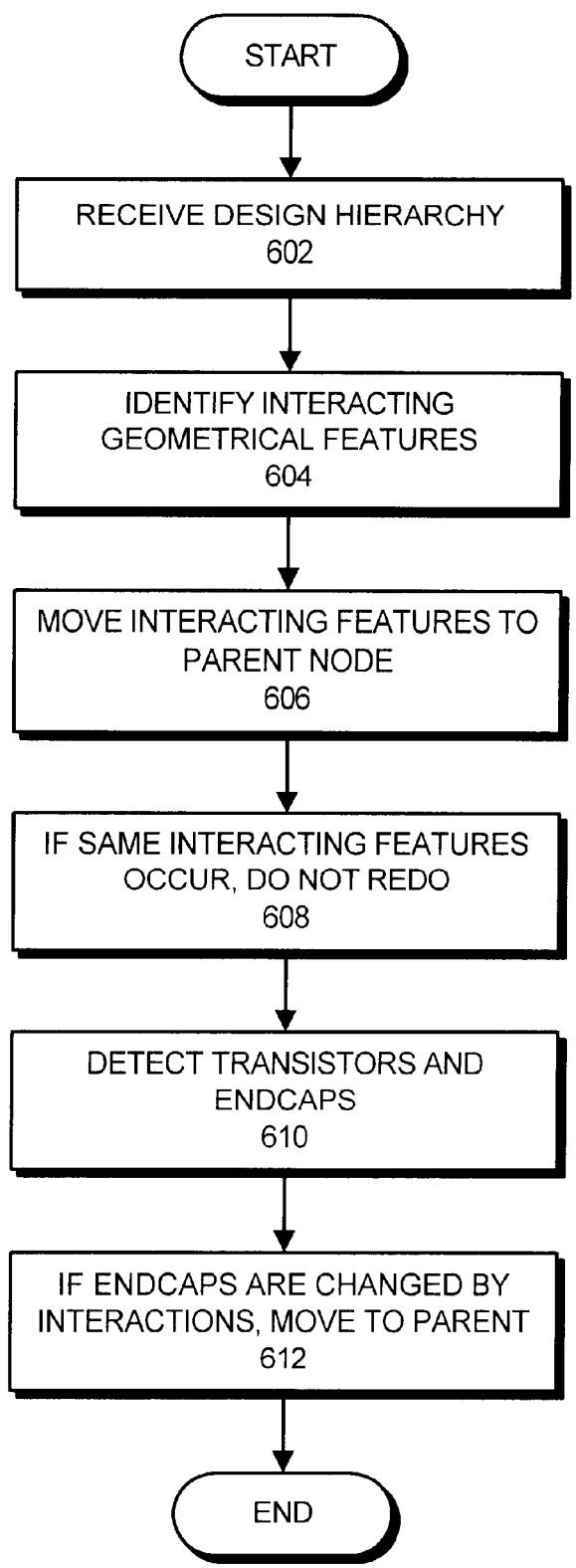
FIG. 6 presents a flow chart illustrating the processing of a composite gate in accordance with an embodiment of the invention.

FIG. 6 presents a flow chart illustrating the processing of a composite gate in accordance with an embodiment of the invention. The system starts by receiving a design hierarchy that specifies the circuit layout (step 602).

Figure 7:
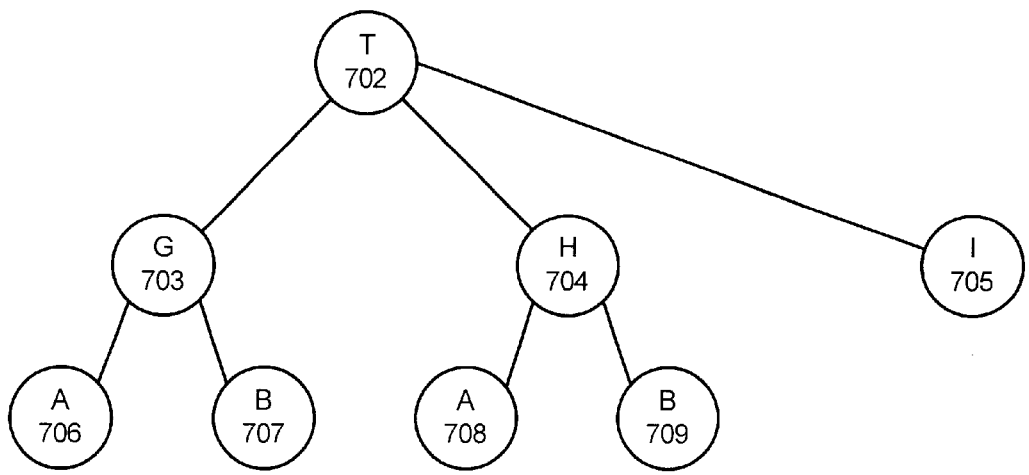
FIG. 7 illustrates an exemplary hierarchical layout in accordance with an embodiment of the invention.

The system first identifies interacting geometrical features (step 604). These interactions can take place between child (sibling) nodes or between the parent node and the child node. For example, in FIG. 7, the system finds interactions between child nodes A 706 and B 707 and between parent node G 703 and child nodes A 706 and B 707. Next, the system moves the interacting features to the parent node G 703 (step 606).

Figure 8:
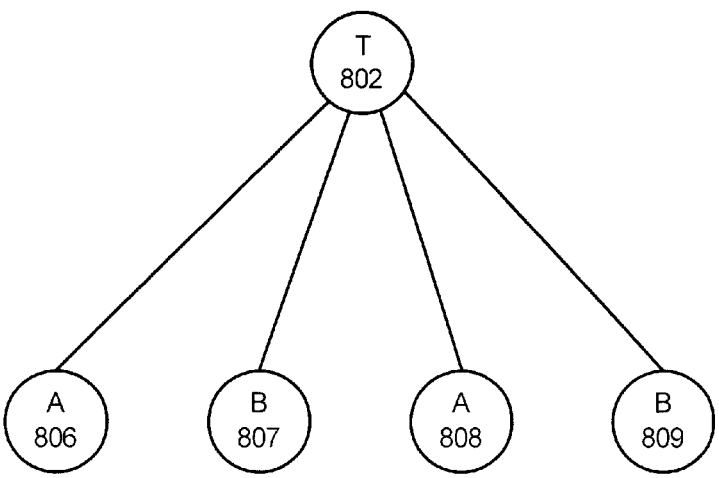
FIG. 8 illustrates an additional exemplary hierarchical layout in accordance with an embodiment of the invention.

If an equivalent set of interacting features occur again in the design hierarchy, the system does not redo the analysis, but instead uses the analysis that has already been done for the interacting geometrical features (step 608). For example referring to FIG. 8, if the same interacting geometrical features occur under parent node T 802 between sibling nodes A 808 and B 809, the system does note redo the analysis on the interacting features for nodes A 808 and B 809, but instead reuses the analysis for nodes A 806 and B 807.

Note that the system determines if a set of interacting features are equivalent by determining if they have the same cells interacting with the same relative transformation with respect to each other. In this case, the region of interaction can be duplicated.

Next, the system detects transistors and associated endcaps for node H 704 (step 610). This can involve determining at cell T 702 whether an endcap in a cell G 703 interacts with other endcaps or polysilicon features in cell H 704 or in cell I 705. If any endcaps are changed through interactions with other cells, the system moves the interacting shapes and their associated gates to the parent node T 702 (step 612). Note that the other features that are not involved in the interaction remain located at the child nodes G 703, H 704 and I 705.

At this point, after diffusion processing 406 and composite gate processing 408 have occurred (see FIG. 4), shifter placement 410 can be performed on the modified design hierarchy, wherein diffusion layers are in child nodes and geometries are in parent nodes.

The data structures and code described in this detailed description are typically stored on a computer readable storage medium, which may be any device or medium that can store code and/or data for use by a computer system.

This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

The preceding description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the above disclosure is not intended to limit the invention. The scope of the invention is defined by the appended claims.

What is claimed is:

1. A method for analyzing a layout related to a circuit on a semiconductor chip, comprising:
   receiving a design hierarchy specifying the layout of the circuit, including a set of hierarchically-organized nodes;
   wherein a given node in the design hierarchy specifies a geometrical feature that is comprised of lower-level geometrical features that are represented by lower-level nodes located under the given node in the design hierarchy;
   modifying the design hierarchy to produce a modified design hierarchy by,
      examining a set of sibling nodes that are located under a parent node in the design hierarchy,
      identifying a set of interacting geometrical features between the set of sibling nodes, and
      moving the set of interacting geometrical features from the sibling nodes to the parent node, so that the interaction is visible at the parent node,
      wherein other geometrical features that do not interact remain at the sibling nodes and are not moved to the parent node;
   performing an analysis on the modified design hierarchy;
   identifying other sets of sibling nodes with equivalent sets of interacting geometrical features; and
   using results from analyzing the set of interacting geometrical features in analyzing the equivalent sets of interacting geometrical features, so that the analysis does not have to be repeated for the equivalent sets of interacting geometrical features;
   wherein performing the analysis involves analyzing the set of interacting geometrical features at the parent node.

2. The method of claim 1, wherein performing the analysis involves:
   identifying transistors and associated transistor endcaps within the circuit;
   wherein the set of interacting geometrical features defines at least some of the transistors and associated transistor endcaps; and
   generating phase shifters to be used in fabricating some of the identified transistors;
   wherein the layout of a given phase shifter is affected by a location of an associated endcap for the given phase shifter.

3. The method of claim 1, further comprising determining at a parent node whether interactions between related sibling nodes cause transistor endcaps to become fieldcaps, and if so, moving geometrical features that caused the interactions to the parent node.

4. The method of claim 1, wherein modifying the design hierarchy additionally involves:
   identifying a second set of interacting geometrical features between the parent node and the set of sibling nodes; and
   moving the second set of interacting geometrical features from the set of sibling nodes to the parent node.

5. The method of claim 1, wherein the set of interacting geometrical features define polysilicon regions and diffusion regions on the semiconductor chip.

6. The method of claim 1, wherein the layout can define:
   features on the semiconductor chip; and
   a mask that is used to create features on the semiconductor chip.

7. The method of claim 1, wherein the design hierarchy is specified in GDSII format.

8. A computer-readable storage medium storing instructions that when executed by a computer cause the computer to perform a method for analyzing a layout related to a circuit on a semiconductor chip, the method comprising:
   receiving a design hierarchy specifying the layout of the circuit, including a set of hierarchically-organized nodes;
   wherein a given node in the design hierarchy specifies a geometrical feature that is comprised of lower-level geometrical features that are represented by lower-level nodes located under the given node in the design hierarchy;
   modifying the design hierarchy to produce a modified design hierarchy by,
      examining a set of sibling nodes that are located under a parent node in the design hierarchy,
      identifying a set of interacting geometrical features between the set of sibling nodes, and
      moving the set of interacting geometrical features from the sibling nodes to the parent node, so that the interaction is visible at the parent node,
      wherein other geometrical features that do not interact remain at the sibling nodes and are not moved to the parent node;
   performing an analysis on the modified design hierarchy;
   identifying other sets on sibling nodes with equivalent sets of interacting geometrical features; and
   using results from analyzing the set of interacting geometrical features in analyzing the equivalent sets of interacting geometrical features so that the analysis does not have to be repeated for the equivalent sets of interacting geometrical features;
   wherein performing the analysis involves analyzing the set of interacting geometrical features at the parent node.

9. The computer-readable storage medium of claim 8, wherein performing the analysis involves:
   identifying transistors and associated transistor endcaps within the circuit;
   wherein the set of interacting geometrical features defines at least some of the transistors and associated transistor endcaps; and
   generating phase shifters to be used in fabricating some of the identified transistors;
   wherein the layout of a given phase shifter is affected by a location of an associated endcap for the given phase shifter.

10. The computer-readable storage medium of claim 9, wherein the method further comprises, determining at a parent node whether interactions between related sibling nodes cause transistor endcaps to become fieldcaps, and if so, moving geometrical features that caused the interactions to the parent node.

11. The computer-readable storage medium of claim 8, wherein modifying the design hierarchy additionally involves:
   identifying a second set of interacting geometrical features between the parent node and the set of sibling nodes; and
   moving the second set of interacting geometrical features from the set of sibling nodes to the parent node.

12. The computer-readable storage medium of claim 8, wherein the set of interacting geometrical features define polysilicon regions and diffusion regions on the semiconductor chip.

13. The computer-readable storage medium of claim 8, wherein the layout can define:
   features on the semiconductor chip; and
   a mask that is used to create features on the semiconductor chip.

14. The computer-readable storage medium of claim 8, wherein the design hierarchy is specified in GDSII format.

15. An apparatus for analyzing a layout related to a circuit on a semiconductor chip, comprising:
   a receiving mechanism that is configured to receive a design hierarchy specifying the layout of the circuit, including a set of hierarchically-organized nodes;
   wherein a given node in the design hierarchy specifies a geometrical feature that is comprised of lower-level geometrical features that are represented by lower-level nodes located under the given node in the design hierarchy;
   a modification mechanism that is configured to modify the design hierarchy to produce a modified design hierarchy;
   wherein the modification mechanism is configured to,
      identify a set of interacting geometrical features between a set of sibling nodes that are located under a parent node in the design hierarchy, and to
      move the set of interacting geometrical features from the sibling nodes to the parent node, so that the interaction is visible at the parent node,
      wherein other geometrical features that do not interact remain at the sibling nodes and are not moved to the parent node;
   an analysis mechanism that is configured to perform an analysis on the modified design hierarchy; and
   an identification mechanism that is configured to identify other sets of sibling nodes with equivalent sets of interacting geometrical features;
   wherein the analysis mechanism is configured to use results from analyzing the set of interacting geometrical features in analyzing the equivalent sets of interacting geometrical features, so that the analysis does not have to be repeated for the equivalent sets of interacting geometrical features; and
   wherein performing the analysis involves analyzing the set of interacting geometrical features at the parent node.

16. The apparatus of claim 15, wherein the modification mechanism is additionally configured to:
   identify transistors and associated transistor endcaps within the circuit;
   wherein the set of interacting geometrical features defines at least some of the transistors and associated transistor endcaps; and to
   generate phase shifters to be used in fabricating some of the identified transistors;
   wherein the layout of a given phase shifter is affected by a location of an associated endcap for the given phase shifter.

17. The apparatus of claim 16, wherein the apparatus is further configured to determine at a parent node whether interactions between related sibling nodes cause transistor endcaps to become fieldcaps, and if so, to move geometrical features that caused the interactions to the parent node.

18. The apparatus of claim 16, wherein the modification mechanism is additionally configured to:
   identify a second set of interacting geometrical features between the parent node and the set of sibling nodes; and to
   move the second set of interacting geometrical features from the set of sibling nodes to the parent node.

19. The apparatus of claim 16, wherein the set of interacting geometrical features define polysilicon regions and diffusion regions on the semiconductor chip.

20. The apparatus of claim 16, wherein the layout can define:
   features on the semiconductor chip; and
   a mask that is used to create features on the semiconductor chip.

21. The apparatus of claim 16, wherein the design hierarchy is specified in GDSII format.

22. A means for analyzing a layout related to a circuit on a semiconductor chip, comprising:
   a receiving means for receiving a design hierarchy specifying the layout of the circuit, including a set of hierarchically-organized nodes;
   wherein a given node in the design hierarchy specifies a geometrical feature that is comprised of lower-level geometrical features that are represented by lower-level nodes located under the given node in the design hierarchy;
   a modification means for modifying the design hierarchy to produce a modified design hierarchy;
   wherein the modification means includes,
      an examination means for examining a set of sibling nodes that are located under a parent node in the design hierarchy,
      an identification means for identifying a set of interacting geometrical features between the set of sibling nodes, and
      a moving means for moving the set of interacting geometrical features from the sibling nodes to the parent node, so that the interaction is visible at the parent node,
      wherein other geometrical features that do not interact remain at the sibling nodes and are not moved to the parent node;
   an analysis means for performing an analysis on the modified design hierarchy; and
   an identification means for identifying other sets of sibling nodes with equivalent sets of interacting geometrical features;

wherein the analysis means uses results from analyzing the set of interacting geometrical features in analyzing the equivalent sets of interacting geometrical features, so that the analysis does not have to be repeated for the equivalent sets of interacting geometrical features; and wherein performing the analysis involves analyzing the set of interacting geometrical features at the parent node.

* * * * *

UNITED STATES PATENT AND TRADEMARK OFFICE
CERTIFICATE OF CORRECTION

PATENT NO. : 6,738,958 B2  Page 1 of 1
DATED : May 18, 2004
INVENTOR(S) : Masoud Manoo It is certified that error appears in the above-identified patent and that said Letters Patent is hereby corrected as shown below:

<u>Column 7,</u>
Line 66, please delete the reference "claim 1" and replace with the reference -- claim 2 --.

Signed and Sealed this

Twenty-seventh Day of July, 2004

JON W. DUDAS
*Acting Director of the United States Patent and Trademark Office*